United States Patent
Bonsdorf et al.

(10) Patent No.: US 6,833,324 B2
(45) Date of Patent: Dec. 21, 2004

(54) PROCESS AND DEVICE FOR CLEANING A SEMICONDUCTOR WAFER

(75) Inventors: Grit Bonsdorf, Dresden (DE); Wolfgang Dickenscheid, Dresden (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/424,173

(22) Filed: Apr. 25, 2003

(65) Prior Publication Data

US 2003/0186553 A1 Oct. 2, 2003

Related U.S. Application Data

(63) Continuation of application No. PCT/EP01/11582, filed on Oct. 8, 2001.

(30) Foreign Application Priority Data

Oct. 25, 2000 (DE) .......................................... 100 52 762

(51) Int. Cl.[7] .............................................. H01L 21/302
(52) U.S. Cl. ........................ 438/691; 438/692; 438/693; 438/745; 134/1.2
(58) Field of Search ................................ 438/691, 692, 438/693, 745, 750; 216/91, 104; 134/1.1, 1.2, 1.3, 2, 26

(56) References Cited

U.S. PATENT DOCUMENTS

| | | | |
|---|---|---|---|
| 4,903,717 A | | 2/1990 | Sumnitsch |
| 5,442,828 A | | 8/1995 | Lutz |
| 5,779,520 A | | 7/1998 | Hayakawa |
| 5,807,439 A | * | 9/1998 | Akatsu et al. ................. 134/32 |
| 5,882,433 A | | 3/1999 | Ueno |
| 5,964,953 A | * | 10/1999 | Mettifogo ....................... 134/2 |
| 5,996,594 A | | 12/1999 | Roy et al. |
| 5,997,653 A | | 12/1999 | Yamasaka |
| 6,017,437 A | * | 1/2000 | Ting et al. ..................... 205/80 |
| 6,026,830 A | * | 2/2000 | Huang ........................... 134/66 |
| 6,099,662 A | * | 8/2000 | Wang et al. ................... 134/26 |
| 6,169,038 B1 | | 1/2001 | Kruwinus et al. |
| 6,557,242 B1 | * | 5/2003 | Santini ..................... 29/603.14 |

FOREIGN PATENT DOCUMENTS

| | | |
|---|---|---|
| DE | 198 01 360 A1 | 7/1999 |
| EP | 0 805 000 A1 | 11/1997 |
| EP | 0 905 747 A1 | 3/1999 |
| EP | 0 938 133 A2 | 8/1999 |
| JP | 09270412 A | 10/1997 |
| JP | 2000-003897 A | 1/2000 |

* cited by examiner

*Primary Examiner*—Lan Vinh
(74) *Attorney, Agent, or Firm*—Laurence A. Greenberg; Werner H. Stemer; Ralph E. Locher

(57) ABSTRACT

A surface of a semiconductor wafer is cleaned following a chemical mechanical polishing process. With the semiconductor wafer rotating continuously, an integrated process sequence is used to etch the surface, rinse the surface, and they dry the surface. The apparatus for cleaning the semiconductor wafer has a turntable in a process chamber for rotating the wafer, a feed for cleaning medium, and a return.

7 Claims, 3 Drawing Sheets

PROCESS AND DEVICE FOR CLEANING A SEMICONDUCTOR WAFER

CROSS-REFERENCE TO RELATED APPLICATION

This application is a continuation of copending International Application No. PCT/EP01/11582, filed Oct. 8, 2001, which designated the United States and which was not published in English.

BACKGROUND OF THE INVENTION

FIELD OF THE INVENTION

The invention relates to a process for cleaning a surface of a semiconductor wafer following a chemical mechanical polishing step and to a device for carrying out a process of this type.

Chemical mechanical polishing (CMP) is increasingly being used in the fabrication of semiconductor components, in particular belonging to the sub-0.5 $\mu$m generation, to planarize the topology which is produced on the semiconductor wafer during the fabrication processes. The chemical mechanical polishing is used predominantly to level trench fillings, metal plugs, e.g. plugs of tungsten in contact holes and vias, and intermediate oxides and intermetal dielectrics.

For chemical mechanical polishing, the semiconductor wafer which is to be polished is pressed by a wafer support onto a rotatable polishing table on which there is an elastically perforated pad which contains a polishing slurry. The semiconductor wafer and the polishing table rotate in opposite directions, with the result that the surface of the semiconductor wafer is polished down at the protruding locations until a substantially completely planar wafer surface is reached. In addition to abrasive polishing grains, the polishing slurries generally contain further active chemical additives which allow selective removal of the layers on the semiconductor wafer. In this context, a distinction is drawn between what is known as a blind polishing process, i.e. a polishing process which is stopped within the layer which is to be polished, and what is known as a stop layer polishing process, wherein the polishing operation is selective with respect to a further layer lying below the layer which is being polished.

During the chemical mechanical polishing operation, slurry impurities are generally left behind on the surface of the semiconductor wafer. The remaining slurry impurities have to be removed in a subsequent cleaning process. For this cleaning operation, after the polishing operation first of all the semiconductor wafers are stored in a water bath, and then the surface impurities are removed using what is known as a brush cleaner. During the brush cleaning, the semiconductor wafer is rinsed continuously with distilled water and/or ammonia. After the brush cleaning process, the semiconductor wafer is then dried by rapid rotation in a drying station. The brush cleaning process illustrated is a single-wafer process, and consequently the wafer throughput is greatly restricted. Furthermore, the required loading and unloading of the brush cleaner and of the drying centrifuges additionally makes the cleaning process very time-consuming. Furthermore, there is a high consumption of distilled water or ammonia during the brush cleaning process.

Instead of the wafer surface being cleaned with the aid of a brush cleaner, a wet cleaning process using chemical baths is also used, wherein the semiconductor wafer is slaved through a plurality of successive cleaning baths, during which process in particular the chemically bonded slurry residues on the semiconductor surface are removed. This chemical cleaning is followed by rinsing with distilled water and then wafer drying; in this case it is preferable to use the so-called Marangoni drying process, wherein the semiconductor wafers are drawn through an isopropanol solution and are then dried in hot nitrogen. With the wet-chemical cleaning process shown, it is possible to clean a plurality of semiconductor wafers simultaneously, with the result that a high wafer throughput can be achieved. However, in this case too the high consumption of chemicals in the cleaning operation and the high outlay on equipment cause problems.

SUMMARY OF THE INVENTION

It is accordingly an object of the invention to provide a method and a device for cleaning a semiconductor wafer which overcomes the above-mentioned disadvantages of the heretofore-known devices and methods of this general type and which allows the removal of impurities which remain on a semiconductor wafer during chemical mechanical polishing quickly and effectively with little outlay on equipment.

With the foregoing and other objects in view there is provided, in accordance with the invention, a semiconductor wafer processing method, which comprises:

subjecting a surface of the semiconductor wafer to a chemical mechanical polishing step; and cleaning the wafer surface of the semiconductor wafer by performing the following steps while continuously rotating the semiconductor wafer:
etching the wafer surface;
rinsing the wafer surface; and
drying the wafer surface.

In accordance with an added feature of the invention, the chemical mechanical polishing step is used to planarize an oxide, and, in that case the following process steps are carried out, while continuously rotating the semiconductor wafer:

rinsing with ozonized distilled water;
etching with an HF solution;
rinsing with ozonized distilled water; and
drying with a gas mixture of isopropanol and nitrogen.

In accordance with an additional feature of the invention, the chemical mechanical polishing step is used to planarize a layer of metal on the semiconductor wafer. In that case, the following process steps are carried out, again while continuously rotating the semiconductor wafer:

etching with an HF solution or an $H_2SO_4$ solution with HF and $H_2O_2$ additions;
rinsing with ozonized distilled water; and
drying with a gas mixture of isopropanol and nitrogen.

In accordance with another feature of the invention, the speed with which the semiconductor wafer is rotated is increased for the drying step.

In accordance with a further feature of the invention, the semiconductor wafer is stored in a water bath between the chemical mechanical polishing step and the cleaning step.

In other words, to clean a surface of a semiconductor wafer following a chemical mechanical polishing step with the semiconductor wafer rotating continuously, the semiconductor wafer is, in succession, firstly rinsed with an etching liquid, then preferably rinsed again with distilled water and then preferably dried using an isopropanol-nitrogen mixture.

This integrated procedure in accordance with the invention makes it possible to combine the process steps, which have hitherto been carried out separately during cleaning, so that process time can be saved and, at the same time, the wafer throughput can be significantly increased. Furthermore, considerable amounts of etching chemicals and distilled water can be saved in particular as a result of the cleaning operation being carried out with the wafer rotating continuously.

According to a preferred refinement, the etching liquid used is of a HF solution, a buffered HF solution or a solution of $H_2SO_4$, $H_2O_2$ and HF. Etching solutions of this type can reliably be used to eliminate slurry impurities such as those which occur in particular in oxide or metal planarization with the aid of a chemical mechanical polishing operation.

With the above and other objects in view there is also provided, in accordance with the invention, a semiconductor wafer processing device, comprising:

- a device formed with a process chamber for receiving a semiconductor wafer following a chemical mechanical polishing process and for cleaning a surface of the semiconductor wafer with the above-summarized method;
- a loading and unloading station for placing the semiconductor wafer in the process chamber and a turntable for holding and rotating the semiconductor wafer; and
- a feed for process media for cleaning the semiconductor wafer communicating with the process chamber, and a return for the process media for cleaning the semiconductor wafer communicating with the process chamber.

In accordance with again an added feature of the invention, the process chamber has independent process stations for the individual cleaning steps, and the turntable is displaceable between the process stations.

In other words, the cleaning device according to the invention has a process chamber which has a loading and unloading station for the semiconductor wafers, a turntable for holding and rotating the semiconductor wafer, and feeds and returns for the process media used to clean the semiconductor wafers. A configuration of this type means that only a single process chamber is required for the entire cleaning operation, including the drying, resulting in a significant saving on equipment. Furthermore, the semiconductor wafer remains in a single chamber throughout the entire cleaning and drying operation, with the result that in particular the risk of surface defects is significantly reduced.

In accordance with a concomitant feature of the invention, there is provided a wet handler connecting the loading and unloading station of the process chamber to a chemical mechanical polishing installation. That is, it is preferred for the process chamber for the cleaning and drying operation to be directly connected to the device for chemical mechanical polishing via a wet handler. This allows an integrated polishing and cleaning process, ensuring a minimal defect density on the semiconductor wafer.

Other features which are considered as characteristic for the invention are set forth in the appended claims.

Although the invention is illustrated and described herein as embodied in a process and device for cleaning a semiconductor wafer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
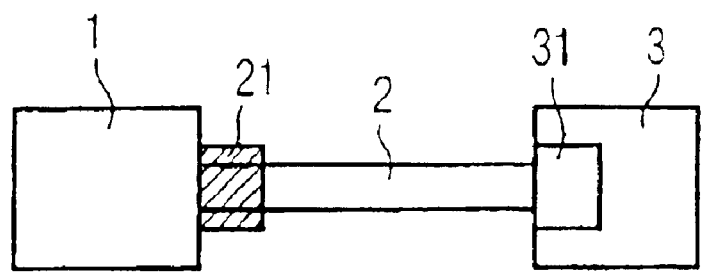
FIG. 1 is a diagrammatic view of a combination installation comprising a chemical mechanical polishing installation and a cleaning station in accordance with the invention.
Figure 3:
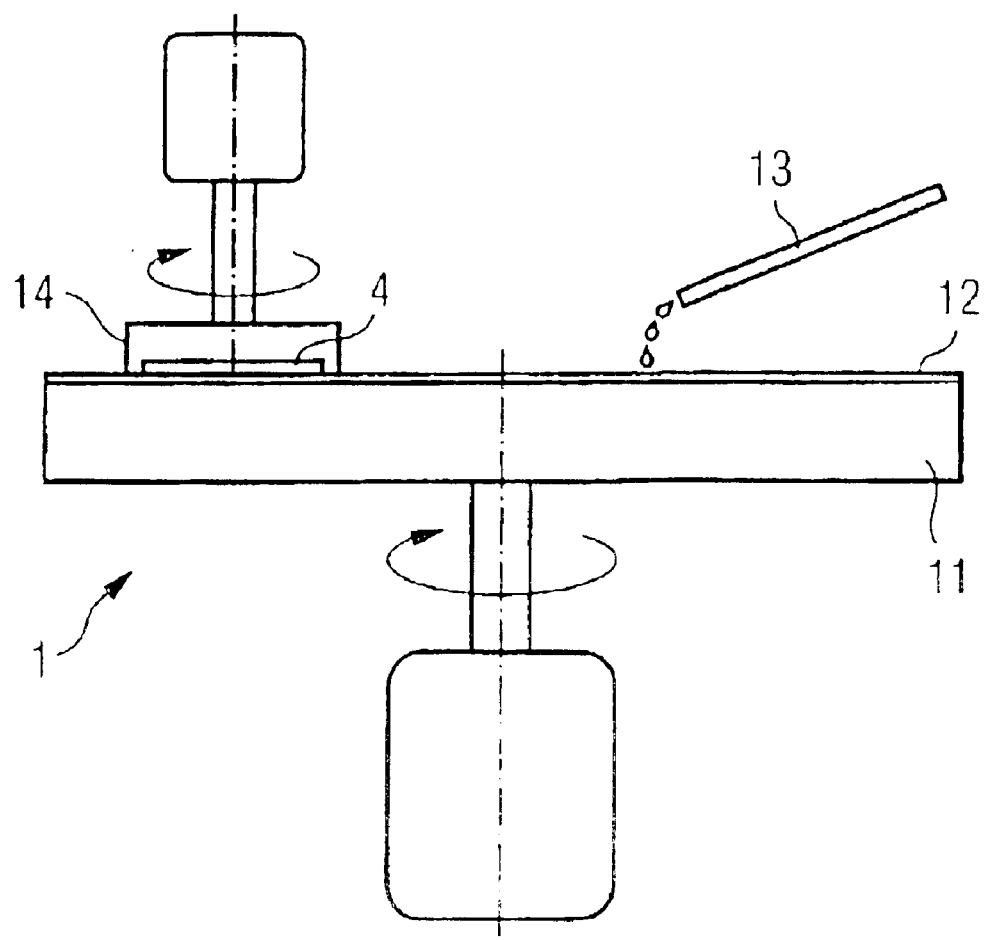
FIG. 3 is a diagrammatic sectional view of a chemical mechanical polishing installation.

Referring now to the figures of the drawing in detail and first, particularly, to FIG. 1 thereof, there is shown a combination installation composed of a polishing installation 1, a wet handler 2 and a cleaning station 3. The polishing installation 1 is diagrammatically depicted in cross section in FIG. 3. On a rotatably arranged polishing table 11 there is an elastically perforated pad 12 which is impregnated with polishing slurry via a feed 13. The semiconductor wafer 4 which is to be machined is pressed onto the pad 12 by a rotatable wafer carrier 14. The wafer carrier 14 with the semiconductor wafer 4 secured to it and the polishing table 11 rotate in mutually opposite directions.

The polishing slurry contains polishing abrasive grains or particles and active chemical additives which allow selective removal of layers on the semiconductor wafer 4. The polishing abrasive grains generally have a mean size of 20 to 500 nm and generally consist of quartz, aluminum oxide or cerium oxide. The chemical additives are matched to the layer material which is to be removed. For example, to planarize tungsten, a mixture of $Al_2O_3$ and $Fe(NO_3)_2$ is used as the slurry. By contrast, to polish an oxide layer the slurry used is in particular a mixture comprising $SiO_2$ as abrasive particles, distilled water and $NH_3$.

Figure 2B:
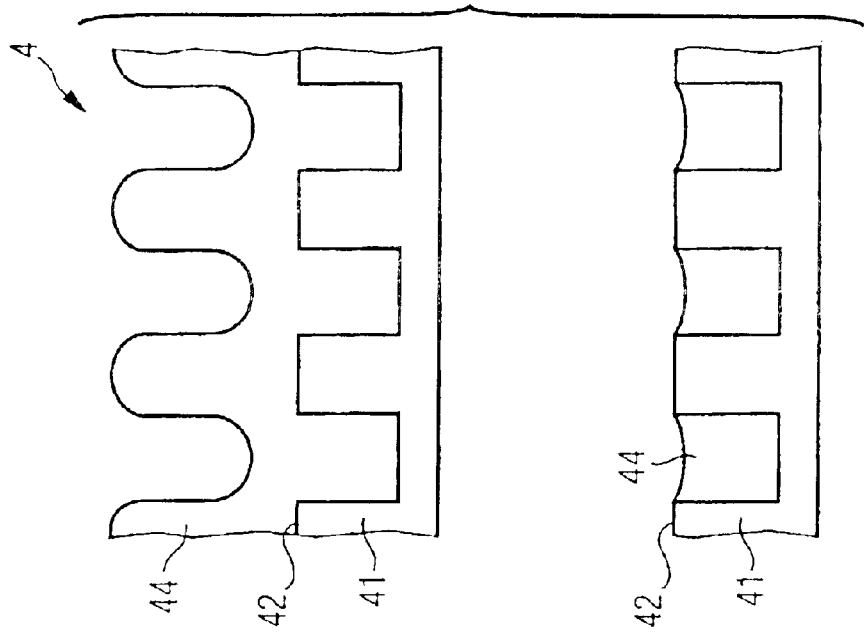
FIG. 2B are two partial sectional views showing a stop layer polishing process.
Figure 2A:
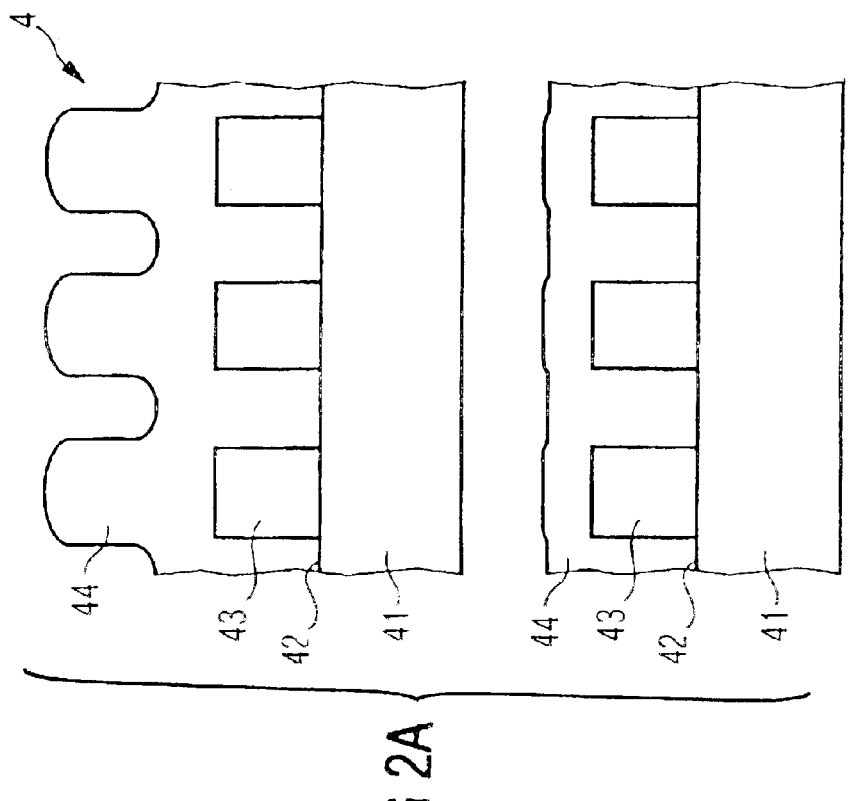
FIG. 2A are two partial sectional views showing a blind polishing process.

The chemical mechanical polishing is used primarily to planarize trench fillings, metal plugs in contact holes and vias, and intermediate oxides and intermetal dielectrics. In this context, a distinction is drawn between two polishing processes which are illustrated in FIGS. 2A and 2B. In what is known as the blind polishing process, as illustrated in FIG. 2A on the basis of a layer structure comprising an Si substrate 41, a thin $Si_2N_3$ layer 42 and metal interconnects 43 arranged thereon, which are filled with a thick $SiO_2$ layer 44, the planarization of the $SiO_2$ layer 44 is controlled in such a way that the polishing process is stopped while it is still within the $SiO_2$ layer which is to be polished. In this case, by way of example, for end point detection it is appropriate to record the thickness of the insulating $SiO_2$ layer with the aid of a capacity measurement. In the case of the stop layer polishing process shown in FIG. 2B, which is illustrated on the basis of a layer structure comprising a silicon layer 41 with trenches, a thin $Si_2N_3$ layer 43 arranged thereon and a thick $SiO_2$ layer 44, the polishing process is stopped when the $Si_2N_3$ layer 42 which lies beneath the $SiO_2$ layer 44 is uncovered. The end point detection may in this case be effected for example by measuring the current consumption of the rotating wafer carrier, since the current changes when a transition between the layer materials is reached.

Figure 4:
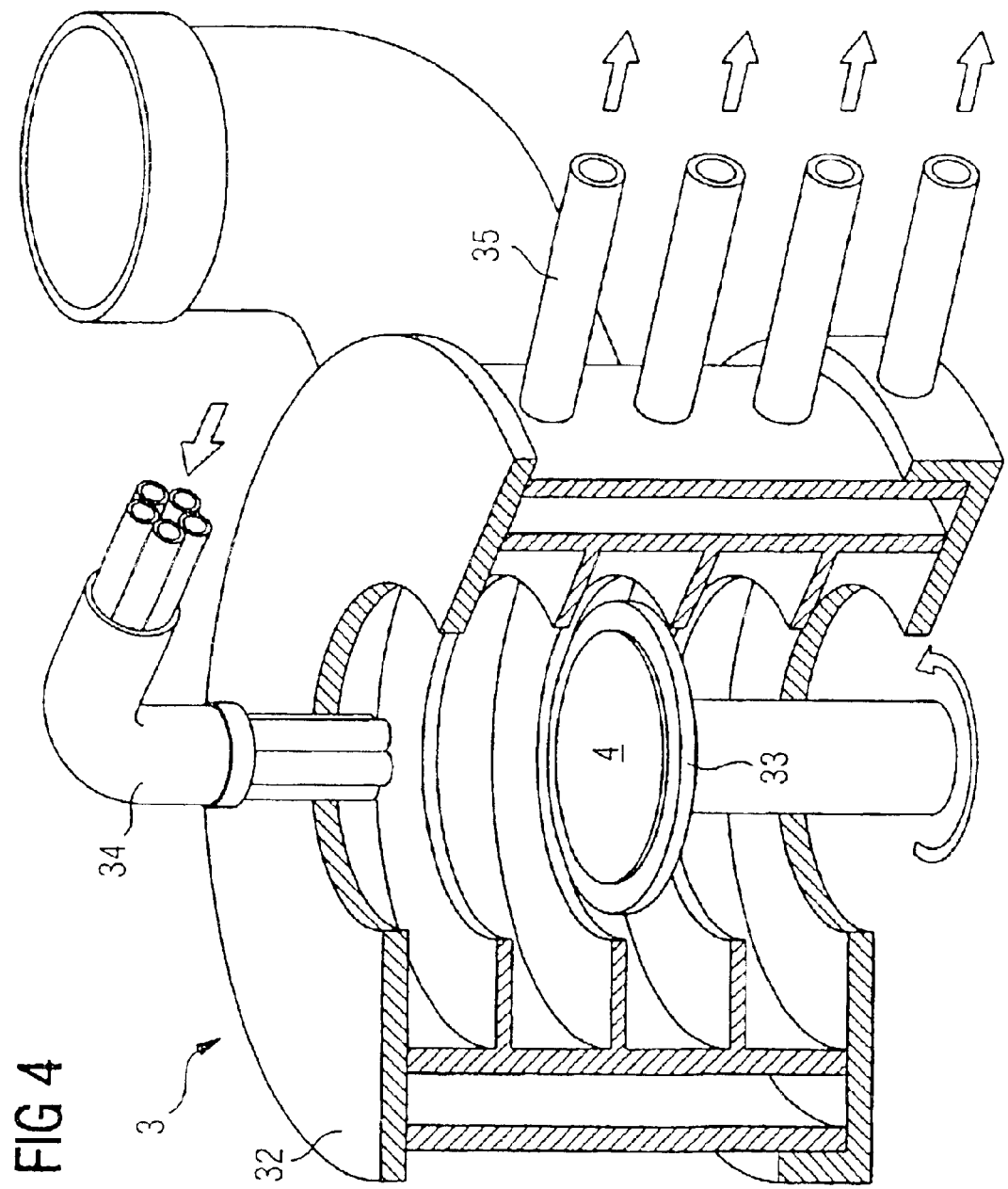
FIG. 4 is a perspective sectional view through a cleaning station according to the invention.

A fundamental problem of chemical mechanical polishing is that slurry residues which adhere to the semiconductor surface after the polishing operation have to be removed. According to the invention, this cleaning takes place in the cleaning installation 3, the main elements of which are illustrated in more detail in section in FIG. 4. The semiconductor wafer 4 which is to be cleaned is transferred directly from the polishing installation 1 to the cleaning station 3 with the aid of the wet handler 2. The wet handler 2 comprises a water bath 21, wherein the semiconductor wafer which is to be cleaned is temporarily stored before being moved to the cleaning station 3. This continuous structure of polishing installation 1 and cleaning station 3 significantly simplifies execution of the process and significantly reduces the risk of defects being formed on the semiconductor surface during transfer from the polishing installation to the cleaning station.

The cleaning station 3 according to the invention has a loading and unloading station 31 which is connected to the wet handler 2, and a cleaning chamber 32 is connected to the loading and unloading station 31. This cleaning chamber 32 is of substantially cylindrical design and is divided into a plurality of vertically arranged subchambers, in the embodiment shown four stations, between which a rotatably mounted table 33 can be displaced in the vertical direction. The semiconductor wafer 4 which is to be cleaned is arranged on this rotary table 33, the semiconductor wafer being held only at the edge, so that the front and back surfaces can be cleaned simultaneously.

Furthermore, above the rotary table 33 there is a feed 34 having in this case five supply lines in order to feed the process medium for the individual cleaning steps for the semiconductor surface into the cleaning chamber 32. Furthermore, at each of the subchambers of the cleaning chamber 32 there is a return 35 in order to enable the process media which flow off the semiconductor wafer to be collected and recovered. The provision of a plurality of process levels arranged above one another in the form of subchambers between which the rotary table 33 can be moved makes it possible to provide in each case a separate process station for the successive cleaning steps, so that the process media used in the cleaning chamber can be cleanly separated from one another. Furthermore, the cleaning station may be designed in such a way that a plurality of cleaning chambers arranged in parallel are provided, so that a larger batch of semiconductor wafers can be cleaned simultaneously and in this way a high throughput is achieved.

In order, after a chemical mechanical polishing operation carried out on an oxide layer on the semiconductor wafer, to remove the slurry residues which remain, according to the invention the following process sequence is carried out. The semiconductor wafer rotates on the turntable 33 in the cleaning chamber 32 throughout the entire cleaning operation. In the first subchamber, the semiconductor wafer is rinsed with ozonized distilled water. Then, in the second subchamber, the slurry residues are removed from the semiconductor surface using an HF solution. Then, in the third subchamber, the semiconductor wafer is rinsed again with ozonized distilled water. Finally, in the fourth subchamber, the semiconductor wafer is dried using an isopropanol-nitrogen mixture with an increased rotation speed of the turntable 33. This cleaning process sequence enables slurry residues which are formed during oxide planarization by means of chemical mechanical polishing to be removed quickly and effectively. Only a small number of integrated process steps are required, and only small quantities of distilled water and etching solution are needed for the cleaning.

If, according to the invention, slurry residues which are formed during the planarization of tungsten with the aid of chemical mechanical polishing are to be removed, this is preferably achieved using the following process sequence. With the semiconductor wafer 4 rotating constantly on the rotary table 33, first of all the wafer is rinsed with distilled water, and then the slurry residues are etched away using HF or dilute sulfuric acid with small quantities of HF and $H_2O_2$ in succession in the individual subchambers. Then, the semiconductor wafer is rinsed again with distilled water, and then, in the fourth subchamber, is dried with an isopropanol-nitrogen gas mixture at a high rotational speed. This process sequence is likewise responsible for effective and rapid removal of slurry residues which remain during tungsten planarization by means of chemical mechanical polishing.

If the etching and rinsing liquids are selected appropriately, the process sequence according to the invention can in principle be adapted to all impurities which may occur during chemical mechanical polishing. Therefore, it is within the scope of the invention, over and above the exemplary embodiments presented, in particular to modify the materials and processes described in a suitable way so as to remove residues which remain on a semiconductor wafer during chemical mechanical polishing. The features of the invention which are disclosed in the above description, the drawings and the claims may be of importance both individually and in any desired combination for implementing the invention in its various configurations.

We claim:

1. A semiconductor wafer processing method, which comprises:

subjecting a surface of the semi-conductor wafer to a chemical mechanical polishing step for planarizing an oxide; and cleaning the wafer surface of the semiconductor wafer by performing the following steps while continuously rotating the semiconductor wafer:
rinsing with ozonized distilled water;
etching the wafer surface with an HF solution;
rinsing the wafer surface with ozonized distilled water; and
drying the wafer surface with a gas mixture of isopropanol and nitrogen.

2. The method according to claim 1, which comprises increasing a speed rotating the semiconductor wafer during the step of drying the semiconductor wafer.

3. The method according to claim 1, which comprises storing the semiconductor wafer in a water bath between the chemical mechanical polishing step and the cleaning step.

4. A semiconductor wafer processing method, which comprises:

subjecting a surface of the semiconductor wafer to a chemical mechanical polishing step for planarizing a layer of metal on the semiconductor wafer; and cleaning the wafer surface of the semiconductor wafer by performing the following steps while continuously rotating the semiconductor wafer:
etching the water surface with an HF solution or an $H_2SO_4$ solution with HF and $H_2O_2$ additions;
rinsing the wafer surface with ozonized distilled water; and
drying the wafer surface with a gas mixture of isopropanol and nitrogen.

5. The method according to claim 4, which comprises increasing a speed rotating the semiconductor wafer during the step of drying the semiconductor wafer.

6. A method of cleaning a semiconductor wafer after chemical mechanical polishing, which comprises:

placing a semiconductor wafer, following chemical mechanical polishing of a wafer surface thereof, for planarizing an oxide, into a process chamber equipped with a turntable for holding and rotating the semiconductor wafer; and cleaning the wafer surface, while continuously rotating the semiconductor wafer on the turntable, by;
 rinsing with ozonized distilled waters;
 etching the wafer surface with an HP solution;
 rinsing the wafer surface with ozonized distilled water; and
 drying the wafer surface With a gas mixture of isopropanol and nitrogen.

7. A method of cleaning a semiconductor wafer after chemical mechanical polishing, which comprises:

placing a semiconductor wafer, following chemical mechanical polishing of a wafer surface thereof, for planarizing a layer of metal on the semiconductor wafer, into a process chamber equipped with a turntable for holding and rotating the semiconductor wafer; and cleaning the wafer surface, while continuously rotating the semiconductor wafer on the turntable, by:
 etching the wafer surface with an HF solution or an $H_2SO_4$ solution with HF and $H_2O_2$ additions;
 rinsing the wafer surface with ozonized distilled water; and
 drying the wafer surface with a gas mixture of isopropanol and nitrogen.

* * * * *